US 9,888,555 B2
Feb. 6, 2018

(12) United States Patent
Ando et al.

(10) Patent No.: US 9,888,555 B2
(45) Date of Patent: Feb. 6, 2018

(54) TRANSMISSION SYSTEM FOR TRANSMITTING PULSE LASER BEAM TO EXTREME ULTRAVIOLET LIGHT CHAMBER, AND LASER SYSTEM

(71) Applicant: GIGAPHOTON INC., Tochigi (JP)

(72) Inventors: Masahiko Ando, Oyama (JP); Yoshifumi Ueno, Oyama (JP); Toru Suzuki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/422,489

(22) Filed: Feb. 2, 2017

(65) Prior Publication Data
US 2017/0150591 A1 May 25, 2017

Related U.S. Application Data

(63) Continuation of application No. PCT/JP2014/073661, filed on Sep. 8, 2014.

(51) Int. Cl.
*G01J 3/10* (2006.01)
*H05G 2/00* (2006.01)

(52) U.S. Cl.
CPC .................. *H05G 2/008* (2013.01)

(58) Field of Classification Search
CPC ...................................... H05G 2/008
USPC ..................................... 250/504 R
See application file for complete search history.

(56) References Cited

U.S. PATENT DOCUMENTS

| 8,681,427 B2 | 3/2014 | Bergstedt et al. |
| 2006/0215712 A1 | 9/2006 | Ziener et al. |
| 2008/0149862 A1 | 6/2008 | Hansson et al. |
| 2010/0220756 A1* | 9/2010 | Krzysztof ............... H01S 3/235 372/38.02 |

(Continued)

FOREIGN PATENT DOCUMENTS

| JP | 2006-303461 A | 11/2006 |
| JP | 2010-514214 A | 4/2010 |

(Continued)

OTHER PUBLICATIONS

International Search Report issued in PCT/JP2014/073661; dated Oct. 28, 2014.

(Continued)

*Primary Examiner* — Jason McCormack
(74) *Attorney, Agent, or Firm* — Studebaker & Brackett PC

(57) ABSTRACT

The transmission system may include: an optical path adjustment device configured to substantially unify optical paths of a first pre-pulse laser beam and a second pre-pulse laser beam; an optical path separation device configured to separate the optical paths of the substantially unified first pre-pulse laser beam and the second pre-pulse laser beam to an optical path for the first pre-pulse laser beam and an optical path for the second pre-pulse laser beam; a first beam adjustment device disposed on the optical path for the first pre-pulse laser beam separated by the optical path separation device and configured to adjust a beam parameter of the first pre-pulse laser beam; and a second beam adjustment device disposed on the optical path for the second pre-pulse laser beam separated by the optical path separation device and configured to adjust a beam parameter of the second pre-pulse laser beam.

11 Claims, 10 Drawing Sheets

(56) References Cited

U.S. PATENT DOCUMENTS

| | | | |
|---|---|---|---|
| 2011/0079736 A1 | 4/2011 | Hansson et al. | |
| 2012/0243566 A1 | 9/2012 | Hori et al. | |
| 2013/0327963 A1* | 12/2013 | Lambert | G21K 5/04 250/504 R |
| 2014/0077104 A1 | 3/2014 | Ershov | |
| 2014/0332700 A1 | 11/2014 | Igarashi et al. | |

FOREIGN PATENT DOCUMENTS

| | | |
|---|---|---|
| JP | 2013-004258 A | 1/2013 |
| JP | 2013-175431 A | 9/2013 |
| WO | 2012/173166 A2 | 12/2012 |
| WO | 2013/110968 A1 | 8/2013 |

OTHER PUBLICATIONS

Written Opinion issued in PCT/JP2014/073661; dated Oct. 28, 2014.

* cited by examiner

TRANSMISSION SYSTEM FOR TRANSMITTING PULSE LASER BEAM TO EXTREME ULTRAVIOLET LIGHT CHAMBER, AND LASER SYSTEM

CROSS-REFERENCE TO RELATED APPLICATIONS

The present application is a continuation application of International Application No. PCT/JP2014/073661 filed on Sep. 8, 2014, the content of which is hereby incorporated by reference into this application.

BACKGROUND

1. Technical Field

This disclosure relates to a transmission system for transmitting a pulse laser beam to an extreme ultraviolet light chamber, and a laser system.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An example of the present disclosure may be a transmission system configured to transmit pulse laser beams outputted by a laser apparatus to an extreme ultraviolet light chamber. The laser apparatus may include a first pre-pulse laser apparatus configured to output a first pre-pulse laser beam to illuminate a target supplied to the extreme ultraviolet light chamber and a second pre-pulse laser apparatus configured to output a second pre-pulse laser beam to illuminate the target at a time different from the first pre-pulse laser beam. The transmission system may include: an optical path adjustment device configured to substantially unify an optical path of the first pre-pulse laser beam and an optical path of the second pre-pulse laser beam; an optical path separation device configured to separate the optical paths of the first pre-pulse laser beam and the second pre-pulse laser beam substantially unified by the optical path adjustment device to an optical path for the first pre-pulse laser beam and an optical path for the second pre-pulse laser beam; a first beam adjustment device disposed on the optical path for the first pre-pulse laser beam separated by the optical path separation device and configured to adjust a beam parameter of the first pre-pulse laser beam; and a second beam adjustment device disposed on the optical path for the second pre-pulse laser beam separated by the optical path separation device and configured to adjust a beam parameter of the second pre-pulse laser beam.

BRIEF DESCRIPTION OF THE DRAWINGS

Hereinafter, selected embodiments of the present disclosure will be described with reference to the accompanying drawings.

DETAILED DESCRIPTION

Figure 1:
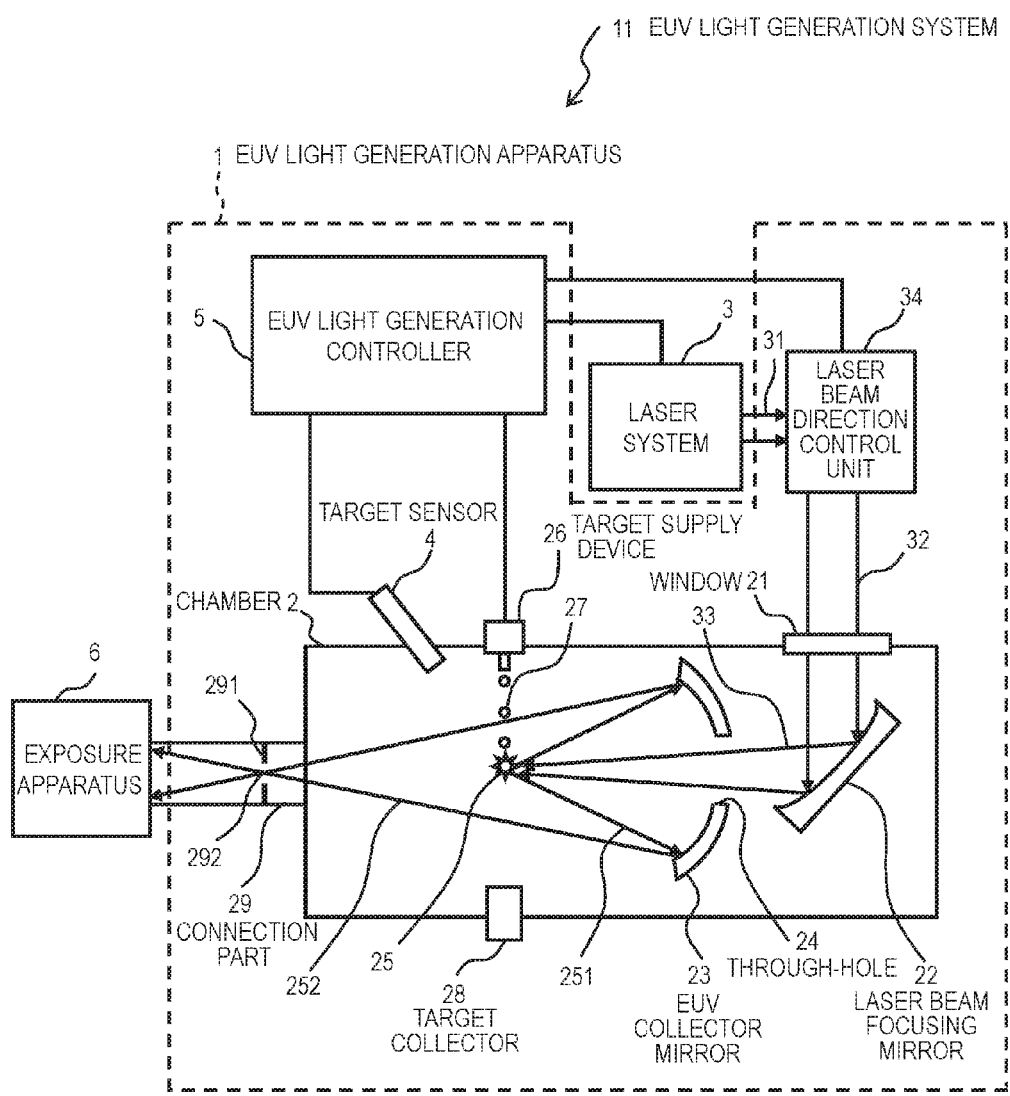
FIG. 1 schematically illustrates an exemplary configuration of an LPP type EUV light generation apparatus.

Contents
1. Overview
2. Overview of EUV Light Generation System
   Configuration
   Operation
3. Issues on EUV Light Generation Apparatus Including Laser Beam Direction Control Unit
   Configuration
   Operation
   States of Target
   Issues
4. Embodiment 1
   Configuration
   Operation
   Effects
5. Embodiment 2
   Issues on Embodiment 1
   Configuration
   Effects 6. Embodiment 3
    Configuration
    Operation
    Effects
7. Beam Adjustment Device
    Configuration Example 1
    Configuration Example 2
8. Beam Monitor
    Configuration Example 1
    Configuration Example 2

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

The present disclosure relates to an EUV light generation system including a laser beam direction control unit. An LPP type EUV light generation system for an exposure apparatus may generate EUV light by irradiating a target that has arrived at a predetermined position in a chamber with a focused pre-pulse laser beam and a focused main pulse laser beam in series to change the target into plasma.

The distance from the pre-pulse laser apparatus to the chamber may be several tens of meters. Two types of pre-pulse laser apparatus may be provided to irradiate a target with pre-pulse laser beams in two steps. The LPP type EUV light generation system may use a common transmission channel to transmit the two types of pre-pulse laser beams to the chamber. This configuration may achieve a smaller package volume and a smaller number of components.

If beam parameters of a pre-pulse laser beam are changed to adjust the irradiation conditions before the entrance of the transmission channel, vignetting or focusing of light may occur in the long transmission channel. Furthermore, for the long-distance transmission, close values of beam parameters may be required between the two types of pre-pulse laser beams. As a result, the adjustable ranges of the beam parameters for the two kinds of pre-pulse laser beams may be limited, causing difficulty in providing optimum irradiation conditions.

An example in the present disclosure may be a system for transmitting laser beams outputted from a laser system to an EUV chamber. The laser system may include a first pre-pulse laser apparatus for outputting a first pre-pulse laser beam and a second pre-pulse laser apparatus for outputting a second pre-pulse laser beam. An optical-path adjustment device may substantially unify the optical paths of the first pre-pulse laser beam and the second pre-pulse laser beam.

An optical-path separation device may separate the optical paths of the first pre-pulse laser beam and the second pre-pulse laser beam substantially unified by the optical-path adjustment device to an optical path for the first pre-pulse laser beam and an optical path for the second pre-pulse laser beam. A first beam parameter adjustment device may be disposed on the optical path separated for the first pre-pulse laser beam to adjust the beam parameters of the first pre-pulse laser beam. The second beam parameter adjustment device may be disposed on the optical path separated for the second pre-pulse laser beam to adjust the beam parameters of the second pre-pulse laser beam.

Regardless of the long-distance transmission, the above-described configuration may adjust the beam parameters of the first pre-pulse laser beam independently from adjustment of the beam parameters of the second pre-pulse laser beam; irradiation conditions may be adjusted readily.

2. Overview of EUV Light Generation System

Configuration

FIG. 1 schematically illustrates an exemplary configuration of an LPP type EUV light generation system. An EUV light generation apparatus 1 may be used with at least one laser system 3. Hereinafter, a system that includes the EUV light generation apparatus 1 and the laser system 3 may be referred to as an EUV light generation system 11. As shown in FIG. 1 and described in detail below, the EUV light generation system 11 may include a chamber 2 and a target supply device 26. The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole formed in its wall, and the pulse laser beam 32 from the laser system 3 may travel through the wall. The chamber 2 may have at least one window 21, and the pulse laser beam 32 from the laser system 3 may travel through the window 21. An EUV collector mirror 23 having a spheroidal surface may, for example, be provided in the chamber 2. The EUV collector mirror 23 may have a first focus and a second focus. The EUV collector mirror 23 may have a multi-layered reflective film including alternately laminated molybdenum layers and silicon layers formed on the surface thereof. The EUV collector mirror 23 is preferably positioned such that the first focus lies in a plasma generation region 25 and the second focus lies in an intermediate focus (IF) region 292. The EUV collector mirror 23 may have a through-hole 24 formed at the center thereof and a pulse laser beam 33 may travel through the through-hole 24.

The EUV light generation apparatus 1 may include an EUV light generation controller 5 and a target sensor 4. The target sensor 4 may have an imaging function and detect at least one of the presence, trajectory, position, and speed of a target.

Further, the EUV light generation system 11 may include a connection part 29 for allowing the interior of the chamber 2 to be in communication with the interior of the exposure apparatus 6. A wall 291 having an aperture may be provided in the connection part 29. The wall 291 may be positioned such that the second focus of the EUV collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the travelling direction of a laser beam and an actuator for adjusting the position, the orientation or posture, and the like of the optical element.

Operation

With reference to FIG. 1, a pulse laser beam 31 outputted from the laser system 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma. The EUV light 251 may be reflected and focused by the EUV collector mirror 23. EUV light 252 reflected by the EUV collector mirror 23 may be focused at the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control: the timing when the target 27 is outputted and the direction into which the target 27 is outputted, for example. Furthermore, the EUV light generation controller 5 may be configured to control at least one of: the timing when the laser system 3 oscillates, the direction in which the pulse laser beam 33 travels, and the position at which the pulse laser beam 33 is focused. It will be appreciated that the various controls mentioned above are merely examples, and other controls may be added as necessary.

Figure 2:
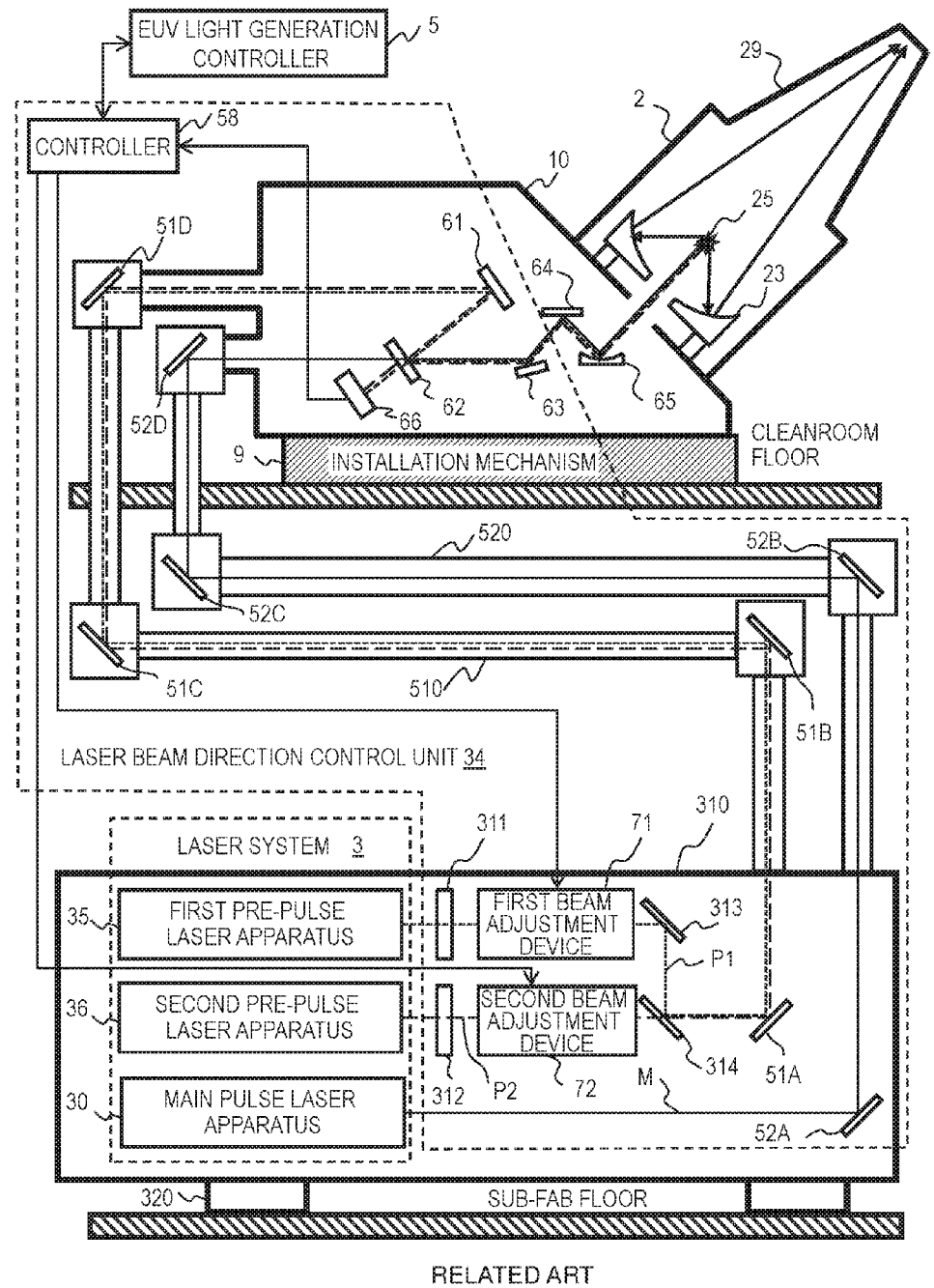
FIG. 2 is a partial cross-sectional diagram of an EUV light generation system in a related art.

3. Issues on EUV Light Generation Apparatus Including Laser Beam Direction Control Unit Configuration FIG. 2 is a partial cross-sectional diagram of an EUV light generation system in a related art. The chamber 2 may be provided on a cleanroom floor and the laser system 3 may be provided on a sub-fab floor. The sub-fab floor may be located downstairs of the cleanroom floor.

The laser system 3 may include a first pre-pulse laser apparatus 35, a second pre-pulse laser apparatus 36, and a main pulse laser apparatus 30. The first pre-pulse laser apparatus 35 may be a Nd:YVO4 laser apparatus for outputting a pre-pulse laser beam P1 having a picosecond-order pulse width.

The second pre-pulse laser apparatus 36 may be a Nd:YAG laser apparatus for outputting a pre-pulse laser beam P2 having a nanosecond-order pulse width. The pre-pulse laser beam P2 may be a laser beam having the same wavelength as the pre-pulse laser beam P1.

The picosecond-order pulse width may be a pulse width not less than 100 fs and less than 1 ns. The maximum pulse width may be a pulse width at which a target may break up and disperse into a semi-spherical dome shape at low density. The laser apparatus for a pulse width of 100 fs to 50 ps may include a mode-locked laser as an oscillator. The laser apparatus for a pulse width not less than 50 ps may include a semiconductor laser as an oscillator.

In place of the laser apparatus for outputting a pre-pulse laser beam having a picosecond-order pulse width, a laser apparatus for outputting a pre-pulse laser beam having a femtosecond-order pulse width may be used. The femtosecond-order pulse width may be a pulse width not less than 1 fs and less than 100 fs. The laser apparatus for the femtosecond-order pulse width may be a mode-locked regenerative amplification laser. For example, a laser apparatus employing the Kerr lens mode-locking technique may be used.

The nanosecond-order pulse width may be a pulse width not less than 1 ns. The maximum nanosecond-order pulse width may be determined to get an optical intensity at which a broken-up target will not disperse sufficiently or a part of the broken-up target will not ionize. Furthermore, the maximum pulse width may be determined depending on the temporal restriction by expansion and dispersion of the target.

The laser apparatus for a pulse width of several to several tens of nanoseconds may be configured to utilize Q-switch oscillation. The laser apparatus for a pulse width wider than that may have an MOPA configuration. For example, the laser apparatus may adopt a semiconductor laser or a CW laser for the oscillator and timely cut out a laser beam with an optical switch on the optical path to obtain a desired pulse width.

The main pulse laser apparatus 30 may be a CO2 laser apparatus for outputting a main pulse laser beam M. The main pulse laser beam M may be a laser beam having a wavelength different from both of the pre-pulse laser beam P1 and the pre-pulse laser beam P2.

The laser beam direction control unit 34 for controlling the traveling directions of the laser beams supplied from the laser system 3 into the chamber 2 may be provided across the cleanroom floor and the sub-fab floor.

The laser system 3 may be secured to the inside of a housing 310 with a not-shown securing device. The housing 310 may be installed on the floor of the sub-fab floor with an air suspension 320. The air suspension 320 may be replaced by another vibration-reducing device.

On the sub-fab floor, the laser beam direction control unit 34 may include a $\lambda/2$ plate 311, a $\lambda/2$ plate 312, a first beam adjustment device 71, a second beam adjustment device 72, a high reflectance mirror 313, a polarizing beam splitter 314 for serving as an optical-path adjustment device, a high reflectance mirror 51A, and a high reflectance mirror 52A.

The $\lambda/2$ plate 311 may be disposed on the optical path of the pre-pulse laser beam P1 to be outputted by the first pre-pulse laser apparatus 35. The $\lambda/2$ plate 312 may be disposed on the optical path of the pre-pulse laser beam P2 to be outputted by the second pre-pulse laser apparatus 36.

The $\lambda/2$ plate 311 and the $\lambda/2$ plate 312 may be configured to make the pre-pulse laser beam P1 and the pre-pulse laser beam P2 in different polarization states. For example, the $\lambda/2$ plates 311 and 312 may be configured to make the pre-pulse laser beam P1 incident on the entrance face of the later-described polarizing beam splitter 314 in an s-polarized state and the pre-pulse laser beam P2 incident on the entrance face of the polarizing beam splitter 314 in a p-polarized state.

The first beam adjustment device 71 may be disposed on the optical path of the pre-pulse laser beam P1 to be outputted by the first pre-pulse laser apparatus 35. The first beam adjustment device 71 may be configured to adjust the beam parameters of the pre-pulse laser beam P1.

The second beam adjustment device 72 may be disposed on the optical path of the pre-pulse laser beam P2 to be outputted by the second pre-pulse laser apparatus 36. The second beam adjustment device 72 may be configured to adjust the beam parameters of the pre-pulse laser beam P2.

Each of the first beam adjustment device 71 and the second beam adjustment device 72 may include a plurality of mirrors or a plurality of lenses. The first beam adjustment device 71 and the second beam adjustment device 72 may include a combination of at least one mirror and at least one lens.

The beam parameters to be adjusted by the first beam adjustment device 71 and the second beam adjustment device 72 may include at least one of the position of the beam, the shape of the beam, the cross-sectional area of the beam, the divergence, the wavefront, and the travelling direction of the beam.

The high reflectance mirror 313 may reflect the pre-pulse laser beam P1 outputted from the first beam adjustment device 71 toward the polarizing beam splitter 314. The polarizing beam splitter 314 may be disposed to substantially unify the optical paths of the pre-pulse laser beam P1 to be outputted from the first beam adjustment device 71 and the pre-pulse laser beam P2 to be outputted from the second beam adjustment device 72. The polarizing beam splitter 314 may be configured to pass incident light in a p-polarized state and reflect incident light in an s-polarized state.

The high reflectance mirror 51A may be disposed on the optical paths of the pre-pulse laser beams P1 and P2 that come out from the polarizing beam splitter 314. The high reflectance mirror 51A may reflect the pre-pulse laser beams P1 and P2 toward the optical conduit 510.

The high reflectance mirror 52A may be disposed on the optical path of the main pulse laser beam M to be outputted by the main pulse laser apparatus 30. The high reflectance mirror 52A may reflect the main pulse laser beam M toward the optical conduit 520.

The laser beam direction control unit 34 may direct the pre-pulse laser beams P1 and P2 reflected by the high reflectance mirror 51A on the sub-fab floor to the cleanroom floor. The laser beam direction control unit 34 may direct the main pulse laser beam M reflected by the high reflectance mirror 52A on the sub-fab floor to the cleanroom floor.

The laser beam direction control unit 34 may include hollow optical conduits 510 and 520 in the region connecting the sub-fab floor and the cleanroom floor. The optical conduit 510 may transmit the pre-pulse laser beams P1 and P2 from the sub-fab floor to the cleanroom floor. The optical conduit 520 may transmit the main pulse laser beam M from the sub-fab floor to the cleanroom floor.

The insides of the optical conduits 510 and 520 may be vacuums; alternatively, the optical conduits 510 and 520 may contain dry air or inert gas introduced thereinto. In the case where dry air or inert gas is introduced into the optical conduits 510 and 520, the gas may have a pressure as low as the vacuum.

Multiple high reflectance mirrors 51B to 51D may be provided in the optical conduit 510. The high reflectance mirrors 51B to 51D may define a transmission channel for directing the pre-pulse laser beams P1 and P2 outputted by the laser system 3 from the sub-fab floor to the cleanroom floor. Each of the high reflectance mirrors 51B to 51D may reflect the pre-pulse laser beams P1 and P2.

Multiple high reflectance mirrors 52B to 52D may be provided in the optical conduit 520. The high reflectance mirrors 52B to 52D may define a transmission channel for directing the main pulse laser beam M outputted by the laser system 3 from the sub-fab floor to the cleanroom floor. Each of the high reflectance mirrors 52B to 52D may reflect the main pulse laser beam M.

On the cleanroom floor, the chamber 2 may be secured to a chamber base member 10. The chamber base member 10 may be fixed on the floor of the cleanroom floor with an installation mechanism 9. The chamber base member 10 may contain a part of the optical elements included in the laser beam direction control unit 34.

On the cleanroom floor, the laser beam direction control unit 34 may include a beam combiner 62, a beam monitor 66, a controller 58, and high reflectance mirrors 61 and 63. The beam combiner 62, the beam monitor 66, and the high reflectance mirrors 61 and 63 may be provided within the chamber base member 10.

The beam combiner 62 may be disposed to substantially unify the optical paths of the pre-pulse laser beams P1 and P2 with the optical path of the main pulse laser beam M. For example, the beam combiner 62 may be a dichroic mirror that reflects the light having the wavelength of the pre-pulse laser beams P1 and P2 at high rate and passes the light having the wavelength of the main pulse laser beam M at high rate.

The high reflectance mirror 61 may reflect the pre-pulse laser beams P1 and P2 reflected by the high reflectance mirror 51D toward the beam monitor 66. The beam combiner 62 may reflect the pre-pulse laser beams P1 and P2 reflected by the high reflectance mirror 61 toward the high reflectance mirror 63 at high rate and also pass parts of the pre-pulse laser beams P1 and P2 reflected by the high reflectance mirror 61 to the beam monitor 66 as sample beams. The beam combiner 62 may pass the main pulse laser beam M reflected by the high reflectance mirror 52D toward the high reflectance mirror 63.

The beam monitor 66 may be configured to measure the beam parameters of small amounts of light of the pre-pulse laser beams P1 and P2 that have passed through the beam combiner 62. The beam monitor 66 may have a light-receiving face for receiving the sample beams. The beam monitor 66 may be configured to output detected values to be used to calculate the parameters on the beam width and the wavefront of each sample beam on the light-receiving face to the controller 58. The parameter on the wavefront may be beam divergence, as mentioned above.

The controller 58 may be connected with the first beam adjustment device 71, the second beam adjustment device 72, the beam monitor 66, and the EUV light generation controller 5. The controller 58 may calculate the parameter values on the beam width and the wavefront of the sample beam based on the detected values outputted from the beam monitor 66.

The controller 58 may control each of the first beam adjustment device 71 and the second beam adjustment device 72 through feedback control using the above-described parameter values so that a sample beam having a beam width and a wavefront within predetermined ranges will be incident on the light-receiving face of the beam monitor 66.

The high reflectance mirror 63 may reflect the pre-pulse laser beams P1 and P2 and the main pulse laser beam M that come from the beam combiner 62 toward a plane mirror 64. The pre-pulse laser beams P1 and P2 and the main pulse laser beam M may be reflected by the plane mirror 64 and the laser beam focusing mirror 65 at high rate and focused on the target supplied to the plasma generation region 25. The target 27 may be irradiated with the pre-pulse laser beams P1 and P2 and the main pulse laser beam M and turn into plasma, which radiates light including EUV light.

Operation

The laser system 3 may output pulse laser beams in the order of the pre-pulse laser beam P1, the pre-pulse laser beam P2, and the main pulse laser beam M. The optical paths of the pre-pulse laser beams P1 and P2 may be substantially unified by the polarizing beam splitter 314. The optical path of the pre-pulse laser beam P1 may go through the λ/2 plate 311 and the first beam adjustment device 71 to reach the polarizing beam splitter 314. The optical path of the pre-pulse laser beam P2 may go through the λ/2 plate 312 and the second beam adjustment device 72 to reach the polarizing beam splitter 314.

Parts of the pre-pulse laser beams P1 and P2 directed to the beam combiner 62 may pass through the beam combiner 62 to enter the beam monitor 66. The pre-pulse laser beams P1 and P2 reflected by the beam combiner 62 may be directed into the chamber 2. In contrast, the main pulse laser beam M may pass through the beam combiner 62 to be directed into the chamber 2.

The beam monitor 66 may measure the beam parameters of the pre-pulse laser beams P1 and P2. The measured values of the beam parameters may be inputted to the controller 58. The controller 58 may control the first beam adjustment device 71 and the second beam adjustment device 72 so that the measured beam parameters will be desired values.

A target 27 may be broken up by being irradiated with the pre-pulse laser beam P1 directed to the chamber 2; the broken-up target 27 may be further broken into finer particles and dispersed by being irradiated with the pre-pulse laser beam P2 to become a dispersed target 27. The dispersed target 27 may be irradiated with the main pulse laser beam M to generate plasma, which may radiate EUV light.

States of Target

Figure 3A:
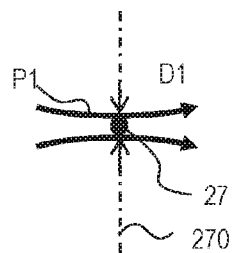
FIG. 3A schematically illustrates a state of a target when being irradiated with a first pre-pulse laser beam.

FIG. 3A schematically illustrates a state of a target when being irradiated with the pre-pulse laser beam P1. The broken line 270 may represent the trajectory of the target 27 and its extension. The pre-pulse laser beam P1 may have a focal diameter D1 substantially equal to or a little larger than the diameter of the target 27. For example, the focal diameter D1 of the pre-pulse laser beam P1 may be 20 μm to 100 μm.

Figure 3B:
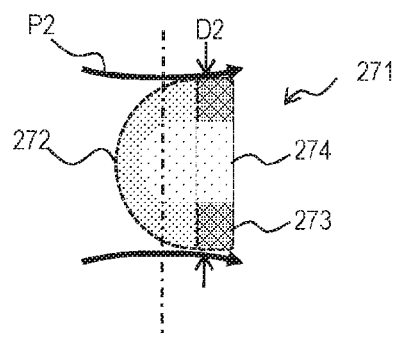
FIG. 3B schematically illustrates a state of a target when being irradiated with a second pre-pulse laser beam.

FIG. 3B schematically illustrates a state of a target when being irradiated with the pre-pulse laser beam P2. In response to irradiation with the pre-pulse laser beam P1, the droplet-shaped target 27 may be broken into a plurality of particles and dispersed, so that a secondary target 271 may be generated.

The density of the dots in FIG. 3B may correspond to the distribution density of the target material. As shown in FIG. 3B, the secondary target 271 generated by being irradiated with the pre-pulse laser beam P1 may have a disc part 273 and a dome part 272.

The disc part 273 may disperse downstream of the optical path of the pre-pulse laser beam P1 and the density of the target material therein may be relatively high. The dome part 272 may disperse upstream of the optical path of the pre-pulse laser beam P1 and the density of the target material therein may be relatively low. Inside of the dome part 272, a part 274 may be generated where the density of the target material is still lower.

As illustrated in FIG. 3B, the broken-up secondary target 271 may be irradiated with the pre-pulse laser beam P2. The pre-pulse laser beam P2 may have a focal diameter D2 approximately equal to or a little larger than the diameter of the broken-up secondary target 271. For example, the focal diameter D2 of the pre-pulse laser beam P2 may be 300 μm to 400 μm. The focal diameter D2 does not need to be a spot diameter at the focal point. In other words, the pre-pulse laser beam P2 may be emitted in a defocusing manner.

Figure 3C:
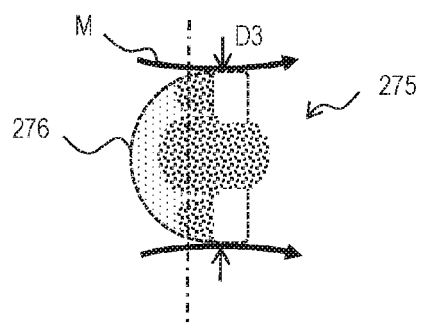
FIG. 3C schematically illustrates a state of a target when being irradiated with a main pulse laser beam.

FIG. 3C schematically illustrates a state of a target when being irradiated with the main pulse laser beam M. When the secondary target 271 shown in FIG. 3B is irradiated with the pre-pulse laser beam P2, a tertiary target 275 including at least either vapor or pre-plasma 276 is generated.

As illustrated in FIG. 3C, the tertiary target 275 including at least either vapor or pre-plasma 276 may be irradiated with the main pulse laser beam M. The main pulse laser beam M may have a focal diameter D3 approximately equal to or a little larger than the dispersion diameter of the tertiary target 275. For example, the focal diameter D3 may be 300 μm to 400 μm.

Figure 3D:
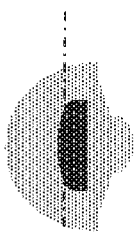
FIG. 3D schematically illustrates a state of a target after being irradiated with the main pulse laser beam.

FIG. 3D schematically illustrates a state of a target after being irradiated with the main pulse laser beam M. When the tertiary target 275 shown in FIG. 3C is irradiated with the main pulse laser beam M, the tertiary target 275 may turn into plasma; the plasma may radiate EUV light.

Issues

As described above, the beam parameters of the two pre-pulse laser beams P1 and P2 having the same wavelength may be adjusted before their optical paths are substantially unified. In the case where the pre-pulse laser beams P1 and P2 are transmitted for a long distance, however, if the divergence is adjusted to be too large before the unification of the optical paths, the beam diameter may become larger than the diameter of the optical conduit 510 to cause vignetting, which may reduce the amount of light of the pre-pulse laser beam P1 or P2 being transmitted.

That is to say, the adjustable ranges of the beam parameters may become smaller as the transmission distance becomes longer. Particularly, the adjustable ranges of the divergence and the beam travelling direction of the beam parameters may become quite small because of the restriction that the beams are transmitted along the same optical path. Furthermore, as the transmission distance becomes longer, the beam parameters of the pre-pulse laser beam P1 and the beam parameters of the pre-pulse laser beam P2 may need to take closer values; this may hamper laser beam irradiation in optimum conditions.

4. Embodiment 1

Configuration

Figure 4:
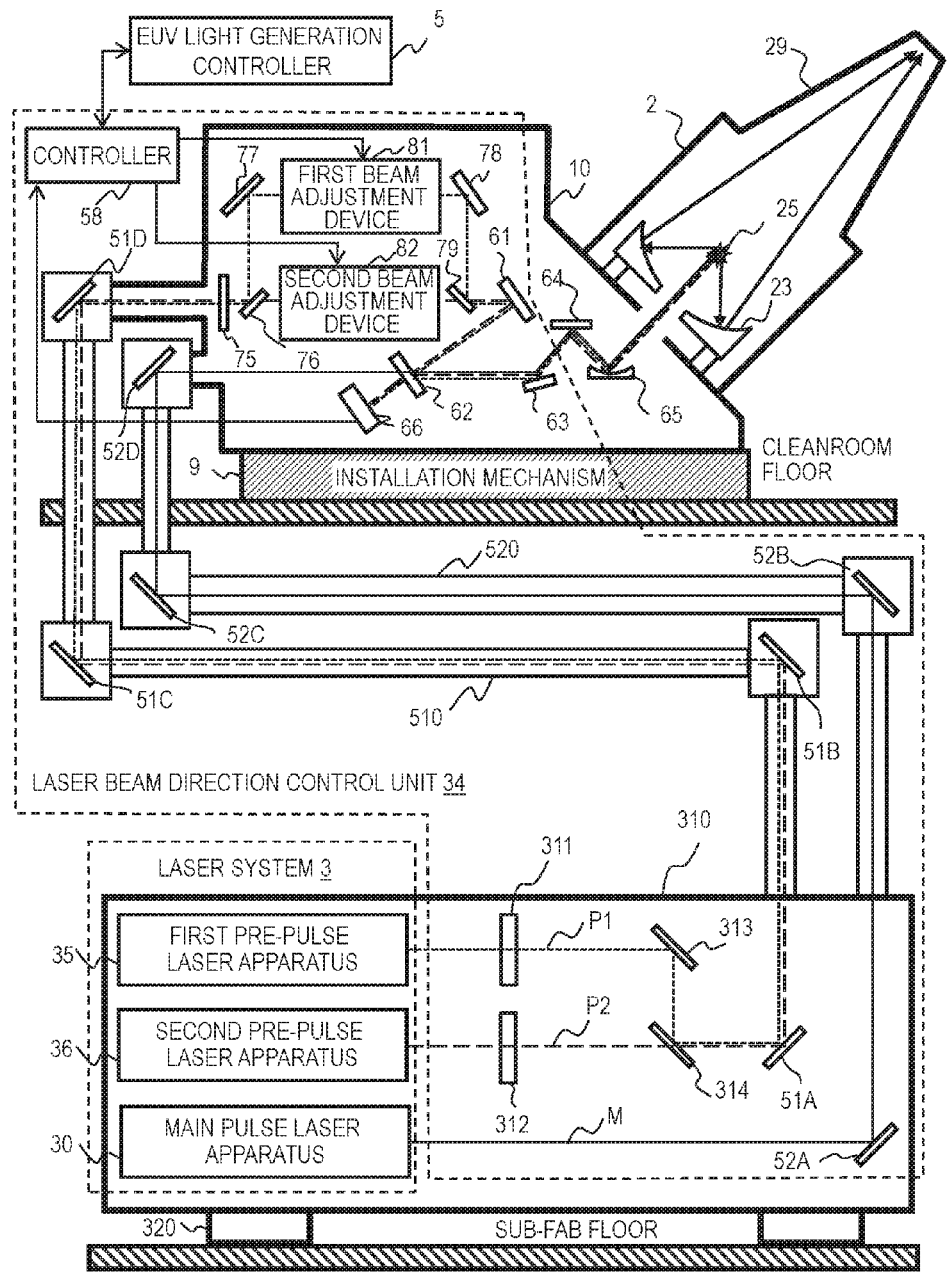
FIG. 4 illustrates a configuration example of an EUV light generation system in Embodiment 1.

FIG. 4 illustrates a configuration example of an EUV light generation system in the present embodiment. Hereinafter, differences from the related art illustrated in FIG. 2 are mainly described. The laser beam direction control unit 34 may omit the first beam adjustment device 71 and the second beam adjustment device 72 on the sub-fab floor described with reference to FIG. 2. However, the first beam adjustment device 71 and the second beam adjustment device 72 do not need to be omitted. The same applies to the other embodiments.

On the cleanroom floor, the laser beam direction control unit 34 may include a λ/2 plate 75, a polarizing beam splitter 76 for serving as an optical-path separation device, a high reflectance mirror 77, a high reflectance mirror 78, a polarizing beam splitter 79, a first beam adjustment device 81, and a second beam adjustment device 82, in addition to the components shown in FIG. 2.

The polarizing beam splitter 314 may be disposed to substantially unify the optical paths of the pre-pulse laser beam P1 to be outputted from the first pre-pulse laser apparatus 35 and the pre-pulse laser beam P2 to be outputted from the second pre-pulse laser apparatus 36. The polarizing beam splitter 314 may be disposed downstream of both of the high reflectance mirror 313 and the λ/2 plate 312.

The λ/2 plate 75 may be disposed on the optical paths of the pre-pulse laser beams P1 and P2 substantially unified by the polarizing beam splitter 314. The λ/2 plate 75 may be located downstream of the high reflectance mirror 51D to receive the pre-pulse laser beams P1 and P2 reflected by the high reflectance mirror 51D.

The polarizing beam splitter 76 may be disposed downstream of the λ/2 plate 75 and on the substantially unified optical paths of the pre-pulse laser beams P1 and P2. The polarizing beam splitter 76 may be disposed to separate the unified optical paths of the pre-pulse laser beams P1 and P2 into an optical path for the pre-pulse laser beam P1 and an optical path for the pre-pulse laser beam P2. For example, the polarizing beam splitter 76 may be configured to pass incident light in a p-polarized state and reflect incident light in an s-polarized state, like the polarizing beam splitter 314.

The first beam adjustment device 81 may be disposed on the optical path of the pre-pulse laser beam P1 separated by the polarizing beam splitter 76. The second beam adjustment device 82 may be disposed on the optical path of the pre-pulse laser beam P2 separated by the polarizing beam splitter 76.

The high reflectance mirror 77 may be disposed upstream of the first beam adjustment device 81 and on the optical path of the pre-pulse laser beam P1. The high reflectance mirror 77 may reflect the pre-pulse laser beam P1 selected by the polarizing beam splitter 76 toward the first beam adjustment device 81.

The high reflectance mirror 78 may be disposed downstream of the first beam adjustment device 81 and on the optical path of the pre-pulse laser beam P1. The high reflectance mirror 78 may reflect the pre-pulse laser beam P1 from the first beam adjustment device 81 toward the polarizing beam splitter 79.

The polarizing beam splitter 79 may be disposed to substantially unify the optical paths of the pre-pulse laser beam P1 to be outputted from the first beam adjustment device 81 and the pre-pulse laser beam P2 to be outputted from the second beam adjustment device 82 again.

The polarizing beam splitter 79 may be disposed downstream of the high reflectance mirror 78 and on the optical path of the pre-pulse laser beam P1. The polarizing beam splitter 79 may be disposed downstream of the second beam adjustment device 82 and on the optical path of the pre-pulse laser beam P2. For example, the polarizing beam splitter 79 may be configured to transmit the light incident in a p-polarized state and reflect the light incident in an s-polarized state, like the polarizing beam splitter 314.

The beam combiner 62 may be disposed to substantially unify the optical paths of the pre-pulse laser beams P1 and P2 to be outputted from the polarizing beam splitter 79 and reflected by the high reflectance mirror 61 with the optical path of the main pulse laser beam M.

If the first pre-pulse laser apparatus 35 and the second pre-pulse laser apparatus 36 output pre-pulse laser beams P1 and P2 in different polarization states, the λ/2 plate 311 and the λ/2 plate 312 may be omitted.

For example, the first pre-pulse laser apparatus 35 may output a pre-pulse laser beam P1 to be incident on the entrance face of the polarizing beam splitter 314 in an s-polarized state and the second pre-pulse laser apparatus 36 may output a pre-pulse laser beam P2 to be incident on the entrance face of the polarizing beam splitter 314 in a p-polarized state.

Operation

Hereinafter, operation of the EUV light generation system 11 in the present embodiment is described. Differences from the related art illustrated in FIG. 2 are mainly described. In FIG. 4, the first pre-pulse laser apparatus 35 and the second pre-pulse laser apparatus 36 may output a pre-pulse laser beam P1 and a pre-pulse laser beam P2, respectively. The pre-pulse laser beam P1 may be outputted at a time different from the pre-pulse laser beam P2; the pre-pulse laser beam P2 may be outputted after the pre-pulse laser beam P1 is outputted.

The pre-pulse laser beams P1 and P2 may travel through the λ/2 plates 311 and 312, respectively, and enter the polarizing beam splitter 314. The optical paths of the pre-pulse laser beams P1 and P2 may be substantially unified by the polarizing beam splitter 314.

The pre-pulse laser beams P1 and P2 to enter the polarizing beam splitter 314 may be linearly-polarized beams having different states. For example, the pre-pulse laser beam P1 may be an s-polarized beam and the pre-pulse laser beam P2 may be a p-polarized beam.

Each of the pre-pulse laser beams P1 and P2 whose optical paths are substantially unified by the polarizing beam splitter 314 may enter the λ/2 plate 75 through the transmission channel defined by the high reflectance mirrors 51A to 51D.

The λ/2 plate 75 may rotate the polarization angles of the pre-pulse laser beams P1 and P2 by a predetermined amount while keeping the difference between the polarization angle of the pre-pulse laser beam P1 and the polarization angle of the pre-pulse laser beam P2. In the transmission channel defined by the high reflectance mirrors 51A to 51D, the pre-pulse laser beams P1 and P2 may be reflected in predetermined various directions. In these events, although the difference between the polarization angle of the pre-pulse laser beam P1 and the polarization angle of the pre-pulse laser beam P2 may be maintained, the polarization angle with respect to a specific reference plane, for example, the ground plane, may be changed from the polarization angle at the time when the pre-pulse laser beam enters the polarizing beam splitter 314.

The polarization angles of the pre-pulse laser beams P1 and P2 to enter the polarizing beam splitter 76 may be corrected so that the polarizing beam splitter 76 will properly separate the optical paths of the pre-pulse laser beams P1 and P2, by adjusting the inclination of the optical axis of the λ/2 plate 75.

Unifying the optical paths of the pre-pulse laser beams P1 and P2 that are linearly-polarized beams having different states by using the polarizing beam splitter 314 and separating the optical paths of the pre-pulse laser beams P1 and P2 by using the polarizing beam splitter 76 may achieve efficient transmission of the pre-pulse laser beams P1 and P2.

The substantially unified optical paths of the pre-pulse laser beams P1 and P2 to be incident on the polarizing beam splitter 76 may be separated by the polarizing beam splitter 76 to the optical path for the pre-pulse laser beam P1 and the optical path for the pre-pulse laser beam P2 depending on the polarization angle.

The selected pre-pulse laser beam P1 may be reflected by the high reflectance mirror 77 toward the first beam adjustment device 81 and adjusted in beam parameters by the first beam adjustment device 81. The selected pre-pulse laser beam P2 may be adjusted in beam parameters by the second beam adjustment device 82.

The pre-pulse laser beam P1 adjusted in beam parameters may be reflected by the high reflectance mirror 78 and enter the polarizing beam splitter 79. The pre-pulse laser beam P2 adjusted in beam parameters may enter the polarizing beam splitter 79. The polarizing beam splitter 79 may reflect the pre-pulse laser beam P1 and pass the pre-pulse laser beam P2. The polarizing beam splitter 79 may substantially unify the optical paths of the pre-pulse laser beams P1 and P2 again.

Parts of the pre-pulse laser beams P1 and P2 directed to the beam combiner 62 through the polarizing beam splitter 79 may pass through the beam combiner 62 and enter the beam monitor 66.

The beam monitor 66 may measure the beam parameters of the pre-pulse laser beams P1 and P2. The measured values of the beam parameters may be inputted to the controller 58. The controller 58 may control the first beam adjustment device 81 and the second beam adjustment device 82 so that the measured beam parameters of the pre-pulse laser beams P1 and P2 will be desired values.

Effects

The present embodiment may separate the optical paths of the pre-pulse laser beam P1 and the optical path of the pre-pulse laser beam P2 posterior to the exit of the transmission channel connecting the sub-fab floor and the main floor and adjust the beam parameters of the pre-pulse laser beams P1 and P2. Accordingly, the present embodiment may eliminate the adjustable ranges of the beam parameters for the pre-pulse laser beams P1 and P2 from being small.

The present embodiment may keep the beam parameters of the pre-pulse laser beams P1 and P2 at close values in the transmission channel and adjust the beam parameters of the pre-pulse laser beam P1 and the beam parameters of the pre-pulse laser beam P2 independently from one another posterior to the exit of the transmission channel. This configuration may readily achieve laser beam irradiation in optimum conditions with each of the pre-pulse laser beams P1 and P2.

The number of pre-pulse laser apparatuses may be three or more. The beam parameter values of the multiple pre-pulse laser beams do not need to be limited to the foregoing example; the pre-pulse laser beams may have different wavelengths and the same pulse width, for example. The optical paths of the pre-pulse laser beams P1 and P2 adjusted in beam parameters may be directed to the chamber 2 while being separate. The EUV light generation system may be configured on the same floor. These may apply to the other embodiments.

5. Embodiment 2

Issues on Embodiment 1

The EUV light generation system 11 in Embodiment 1 illustrated in FIG. 4 may separate the optical paths of the pre-pulse laser beams P1 and P2 with the polarizing beam splitter 76. The pre-pulse laser beam P2 may include light in the polarization state to be reflected by the polarizing beam splitter 76. Accordingly, the polarizing beam splitter 76 may reflect a small part of the pre-pulse laser beam P2 in addition to the pre-pulse laser beam P1, which is originally to be reflected.

Such an optical component in the unintended polarization state may be referred to as polarization-error component. The optical path of the polarization-error component may be unified by the polarizing beam splitter 79 with the optical path of the pre-pulse laser beam P2 that come through the polarizing beam splitter 76.

In this event, the polarization-error component may interfere with the pre-pulse laser beam P2 that come through the polarizing beam splitter 76 to cause speckle. The same phenomenon may occur to the pre-pulse laser beam P1. The speckle may disturb correct observation of the pre-pulse laser beams at the beam monitor 66 and hamper irradiation in favorable conditions.

Configuration

Figure 5:
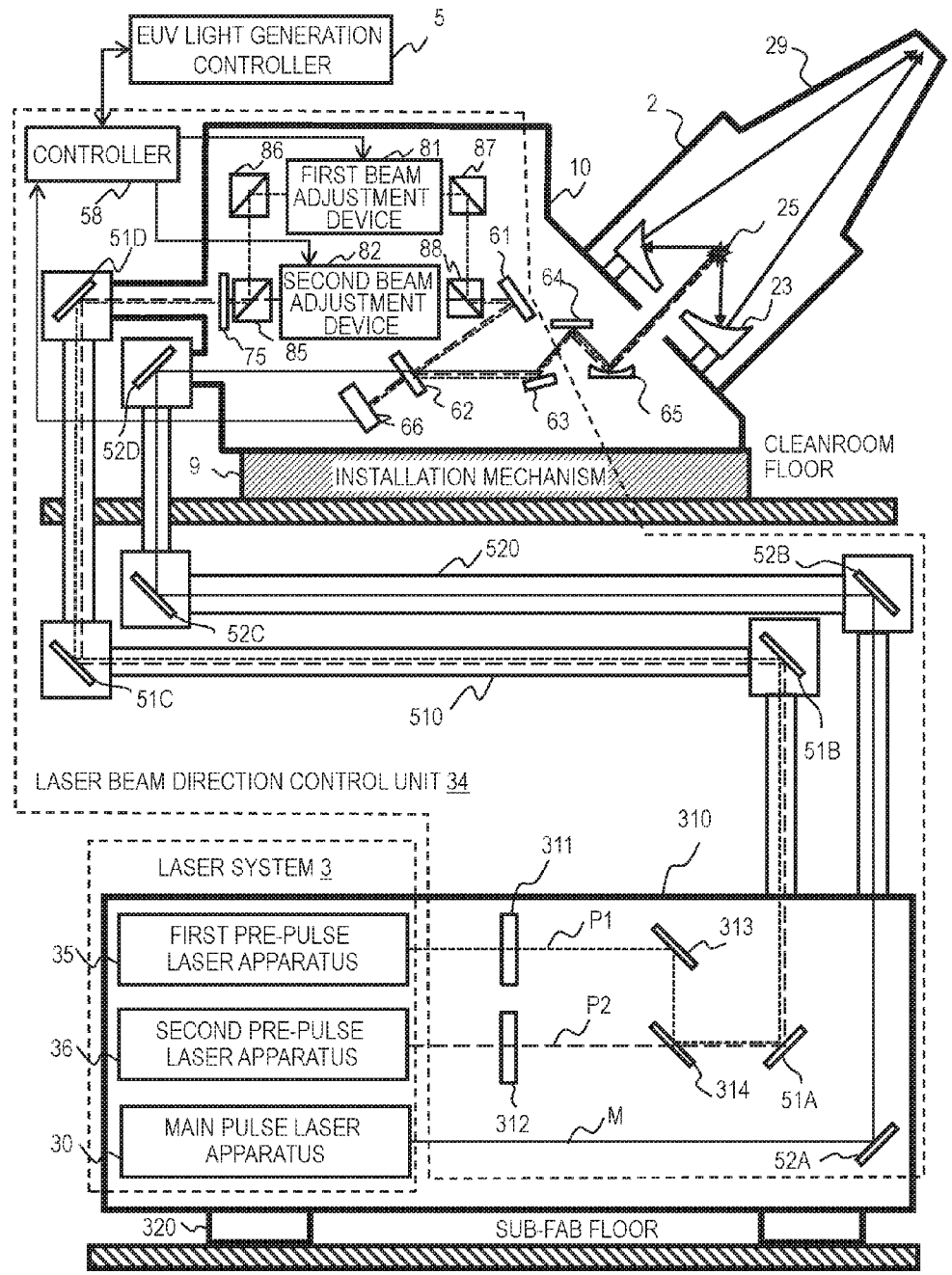
FIG. 5 illustrates a configuration example of an EUV light generation system in Embodiment 2.

FIG. 5 illustrates a configuration example of an EUV light generation system 11 in the present embodiment. Hereinafter, differences from the EUV light generation system 11 in Embodiment 1 illustrated in FIG. 4 are mainly described.

The laser beam direction control unit 34 in the present embodiment may include polarizing beam splitters 86 and 87 in place of the high reflectance mirrors 77 and 78, respectively, in the configuration illustrated in FIG. 4. Furthermore, the polarizing beam splitters 76, 86, 87, and 79 may be cubic polarizing beam splitters 85 to 88.

The cubic polarizing beam splitter 85 may be disposed between the $\lambda/2$ plate 75 and the second beam adjustment device 82 on the optical path of the pre-pulse laser beam P2. The cubic polarizing beam splitter 85 may be disposed between the $\lambda/2$ plate 75 and the cubic polarizing beam splitter 86 on the optical path of the pre-pulse laser beam P1.

The cubic polarizing beam splitter 85 may be disposed to separate the substantially unified optical paths of the pre-pulse laser beams P1 and P2 to an optical path for the pre-pulse laser beam P1 and an optical path for the pre-pulse laser beam P2. For example, the cubic polarizing beam splitter 85 may be configured to pass incident light in a p-polarized state and reflect incident light in an s-polarized state.

The cubic polarizing beam splitter 86 may be disposed upstream of the first beam adjustment device 81 and on the optical path of the pre-pulse laser beam P1 separated by the polarizing beam splitter 85. The cubic polarizing beam splitter 86 may be disposed to reflect the light in the same polarization state as the pre-pulse laser beam P1 toward the first beam adjustment device 81. For example, the cubic polarizing beam splitter 86 may be configured to pass incident light in a p-polarized state and reflect incident light in an s-polarized state.

The cubic polarizing beam splitter 87 may be disposed on the optical path of the pre-pulse laser beam P1 and posterior to the first beam adjustment device 81. The cubic polarizing beam splitter 87 may be disposed to reflect the light in the same polarization state as the pre-pulse laser beam P1 toward the cubic polarizing beam splitter 88. For example, the cubic polarizing beam splitter 87 may be configured to pass incident light in a p-polarized state and reflect incident light in an s-polarized state.

The cubic polarizing beam splitter 88 may be disposed to unify the optical paths of the pre-pulse laser beam P1 to be outputted from the first beam adjustment device 81 and the pre-pulse laser beam P2 to be outputted from the second beam adjustment device 82 again.

The cubic polarizing beam splitter 88 may be disposed downstream of the cubic polarizing beam splitter 87 and on the optical path of the pre-pulse laser beam P1. The cubic polarizing beam splitter 88 may be disposed downstream of the second beam adjustment device 82 and on the optical path of the pre-pulse laser beam P2. For example, the cubic polarizing beam splitter 88 may be configured to pass incident light in a p-polarized state and reflect incident light in an s-polarized state.

Each of the cubic polarizing beam splitters 85 to 88 may be a polarizing beam splitter having another shape. For example, the cubic polarizing beam splitters 85 to 88 may be plate type polarizing beam splitters or wedge plate type polarizing beam splitters.

Effects

In the present embodiment, each optical path along which a specific linearly-polarized pre-pulse laser beam is to propagate is provided with multiple stages of polarizing beam splitters, in place of mirrors. Accordingly, propagation of polarization-error component is prevented to reduce the speckle.

Furthermore, each optical path is provided with cubic polarizing beam splitters, instead of plate type polarizing beam splitters. Accordingly, the amount of shift in optical path may be small between the posterior and the anterior of the polarizing beam splitter. As a result, adjustment of the optical paths may be readily available.

6. Embodiment 3

Configuration

Figure 6:
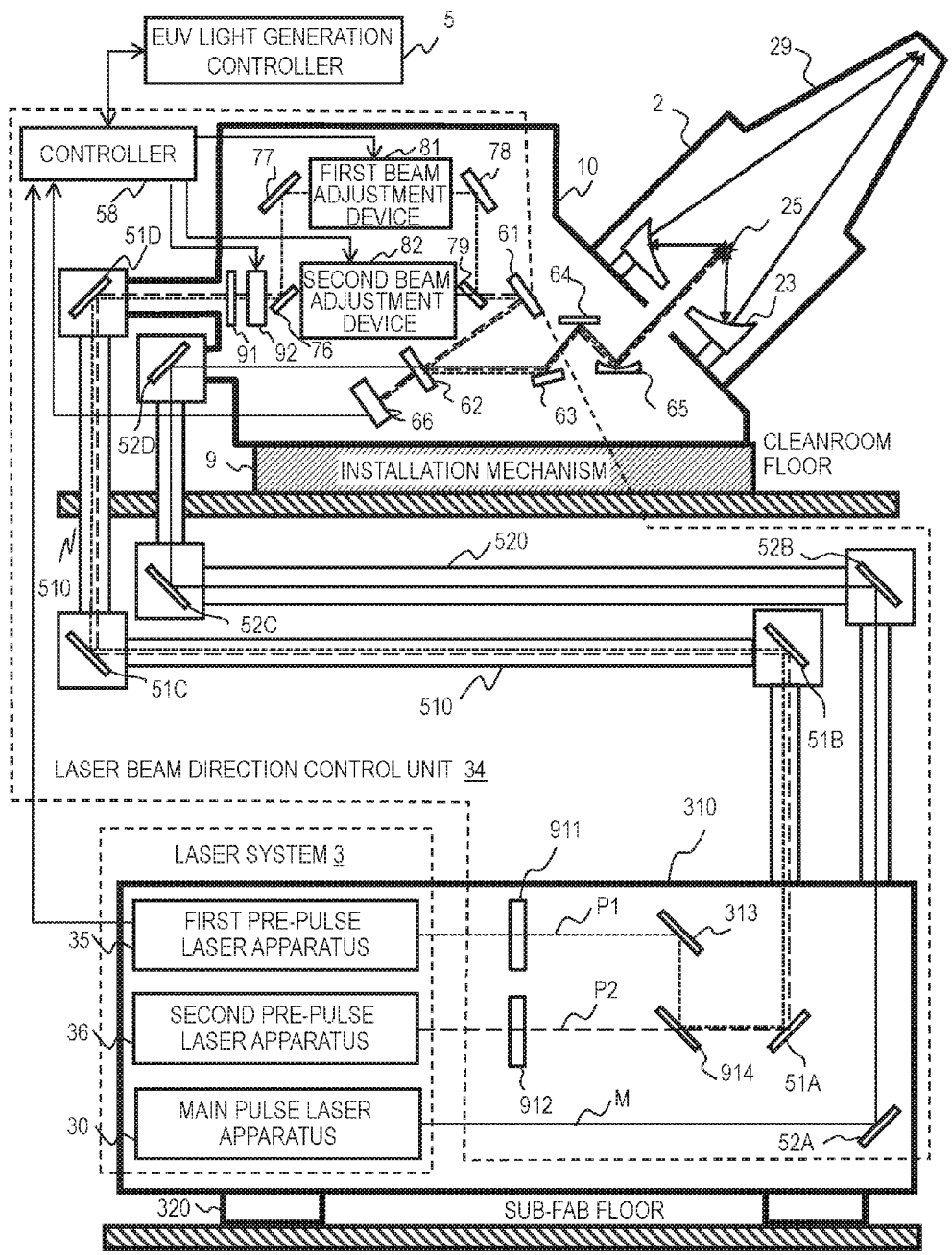
FIG. 6 illustrates a configuration example of an EUV light generation system in Embodiment 3.

FIG. 6 illustrates a configuration example of an EUV light generation system 11 in the present embodiment. Hereinafter, differences from the EUV light generation system 11 in Embodiment 1 illustrated in FIG. 4 are mainly described.

The laser beam direction control unit 34 in the present embodiment may include a λ/4 plate 911, a λ/4 plate 912, and a beam splitter 914 on the sub-fab floor in place of the λ/2 plate 311, the λ/2 plate 312, and the polarizing beam splitter 314, respectively, in the configuration illustrated in FIG. 4. On the cleanroom floor, the laser beam direction control unit 34 may include a λ/4 plate 91 in place of the λ/2 plate 75 in the configuration illustrated in FIG. 4, and further, may include a Pockels cell 92.

The λ/4 plate 911 may be disposed between the first pre-pulse laser apparatus 35 and the high reflectance mirror 313 on the optical path of the pre-pulse laser beam P1. The λ/4 plate 912 may be disposed between the second pre-pulse laser apparatus 36 and the beam splitter 914 on the optical path of the pre-pulse laser beam P2.

The beam splitter 914 may be disposed to substantially unify the optical paths of the pre-pulse laser beam P1 to be outputted from the first pre-pulse laser apparatus 35 and the pre-pulse laser beam P2 to be outputted from the second pre-pulse laser apparatus 36. The reflectance of the beam splitter 914 may be 50%, for example. The beam splitter 914 may be disposed downstream of both of the high reflectance mirror 313 and the λ/4 plate 912.

The λ/4 plate 91 may be disposed on the optical paths of the pre-pulse laser beams P1 and P2 substantially unified by the beam splitter 914. The λ/4 plate 91 may be located downstream of the high reflectance mirror 51D to receive the pre-pulse laser beams P1 and P2 reflected by the high reflectance mirror 51D.

The Pockels cell 92 may be disposed on the optical paths of the pre-pulse laser beams P1 and P2 that come through the λ/4 plate 91. The Pockels cell 92 may be disposed upstream of the first beam adjustment device 81 and the second beam adjustment device 82. The Pockels cell 92 and the first pre-pulse laser apparatus 35 may be connected with the controller 58.

Operation

The pre-pulse laser beams P1 and P2 may be made to be in the same polarization state by the λ/4 plates 911 and 912. For example, both of the pre-pulse laser beams P1 and P2 may be circularly polarized. The pre-pulse laser beam P1 that has passed through the λ/4 plate 911 may be reflected by the high reflectance mirror 313 and enter the beam splitter 914. The pre-pulse laser beam P2 that has passed through the λ/4 plate 912 may enter the beam splitter 914. The beam splitter 914 may substantially unify the optical paths of the pre-pulse laser beams P1 and P2.

The pre-pulse laser beams P1 and P2 traveling along substantially the same optical path may enter the λ/4 plate 91 through the transmission channel defined by the high reflectance mirrors 51A to 51D. The λ/4 plate 91 may transform the pre-pulse laser beams P1 and P2 into linearly-polarized beams in the same state. For example, the pre-pulse laser beams P1 and P2 may be transformed into s-polarized beams with respect to the entrance face of the polarizing beam splitter 76.

The polarizing beam splitter 76 may be configured to reflect an s-polarized beam and transmit a p-polarized beam. The polarizing beam splitter 76 may separate the optical paths of the pre-pulse laser beams P1 and P2 in accordance with the polarization angles of the pre-pulse laser beams P1 and P2.

The Pockels cell 92 may pass the pre-pulse laser beam P1 without changing the polarization state of the pre-pulse laser beam P1. The pre-pulse laser beam P1 that has passed through the Pockels cell 92 may enter the polarizing beam splitter 76. The polarizing beam splitter 76 may reflect the pre-pulse laser beam P1. The pre-pulse laser beam P1 reflected by the polarizing beam splitter 76 may enter the first beam adjustment device 81 via the high reflectance mirror 77.

When the pre-pulse laser beam P2 reaches the Pockels cell 92, the controller 58 may drive a not-shown power supply of the Pockels cell 92 to apply voltage to transform the pre-pulse laser beam P2 to a linearly-polarized beam in a different polarization state.

For example, the pre-pulse laser beam P2 may be transformed to a p-polarized beam with respect to the entrance face of the polarizing beam splitter 76. The polarizing beam splitter 76 may pass the received pre-pulse laser beam P2. The pre-pulse laser beam P2 that has passed through the polarizing beam splitter 76 may enter the second beam adjustment device 82.

The controller 58 may receive the time of output from the first pre-pulse laser apparatus 35 to determine the time for the pre-pulse laser beam P2 to enter the Pockels cell 92. The controller 58 may add a delay time to the received time of output in consideration of the time difference to output the pre-pulse laser beam P2 from the pre-pulse laser beam P1 and the optical path length in sending a drive signal to the power supply of the Pockels cell 92. The controller 58 may receive the time of output from the second pre-pulse laser apparatus 36 to control the Pockels cell 92.

Effects

The present embodiment is configured to transmit circularly-polarized pre-pulse laser beams P1 and P2 along the transmission channel defined by the high reflectance mirrors 51A to 51D. Accordingly, the pre-pulse laser beams P1 and P2 may be prevented from being changed in polarization state in the transmission channel.

7. Beam Adjustment Device

Configuration Example 1

Figure 7A:
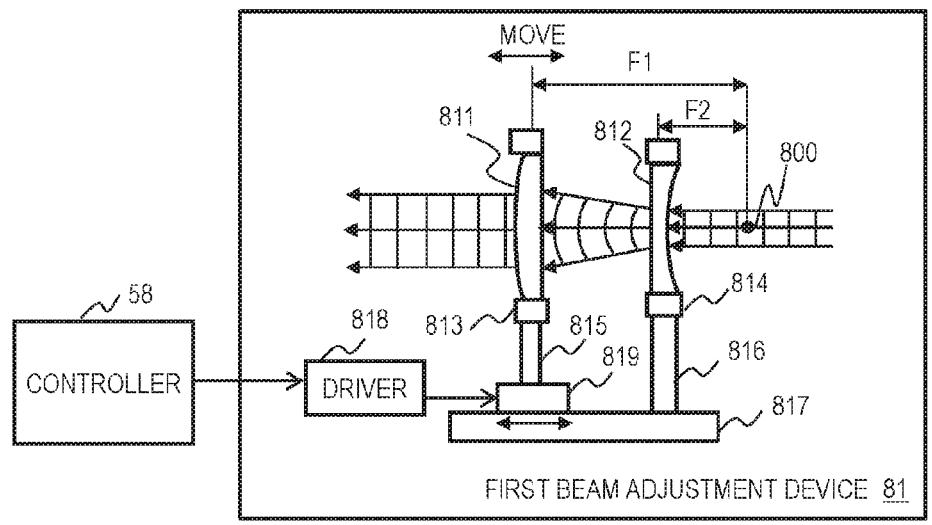
FIG. 7A illustrates a configuration example of a first beam adjustment device.
Figure 7B:
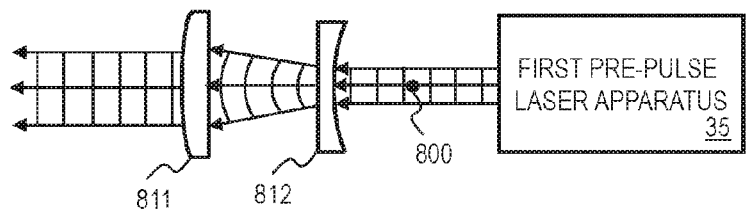
FIG. 7B illustrates the first beam adjustment device in one state.
Figure 7C:
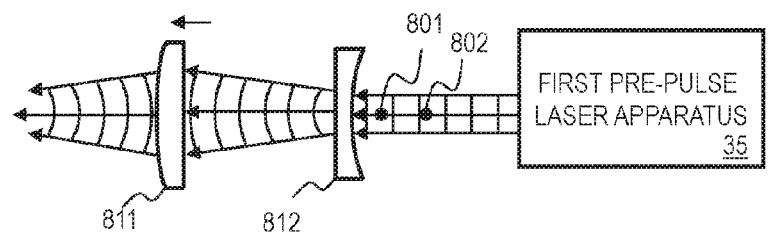
FIG. 7C illustrates the first beam adjustment device in another state.
Figure 7D:
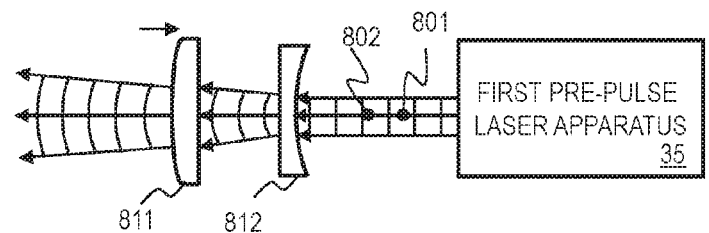
FIG. 7D illustrates the first beam adjustment device in yet another state.

FIG. 7A illustrates a configuration example of the first beam adjustment device 81. FIGS. 7B to 7D illustrate operation of the first beam adjustment device 81. The second beam adjustment device 82 may have the same configuration.

As illustrated in FIG. 7A, the first beam adjustment device 81 may include a spherical convex lens 811 held in a lens holder 813 and a spherical concave lens 812 held in a lens holder 814. The lens holders 813 and 814 may be supported by the supporters 815 and 816, respectively. The supporter 816 may be secured to a fixed stage 817. The supporter 815 may be secured to a slider 819 slidable on the fixed stage 817. A driver 818 may move the slider 819 in accordance with an instruction from the controller 58.

The spherical convex lens 811 may have a focal length F1 and the spherical concave lens 812 may have a focal length F2. In the state shown in FIG. 7A, the focal point of the spherical convex lens 811 may be the same as the focal point of the spherical concave lens 812 at a common focal point 800.

In the state shown in FIG. 7B, the focal point of the spherical convex lens 811 may be the same as the focal point of the spherical concave lens 812 at the common focal point 800. The first beam adjustment device 81 may transform the incident plane waves to plane waves having a different cross-sectional area.

As illustrated in FIG. 7C, the slider 819 may slide downstream from the position shown in FIG. 7B to move the spherical convex lens 811 in the direction away from the spherical concave lens 812. The focal point 801 of the spherical convex lens 811 may be positioned downstream of the focal point 802 of the spherical concave lens 812. The first beam adjustment device 81 may transform the incident plane waves to concave waves.

As illustrated in FIG. 7D, the slider 819 may slide upstream from the position shown in FIG. 7B to move the spherical convex lens 811 in the direction getting closer to the spherical concave lens 812. The focal point 801 of the spherical convex lens 811 may be positioned upstream of the focal point 802 of the spherical concave lens 812. The first beam adjustment device 81 may transform the incident plane waves to convex waves.

As described above, the first beam adjustment device 81 may adjust the wavefront of the laser beam, the cross-sectional area of the laser beam, and the beam divergence. The first beam adjustment device 81 may include a high reflectance mirror and an actuator for controlling the tilt of the high reflectance mirror to control the travelling direction of the laser beam.

Configuration Example 2

Figure 8:
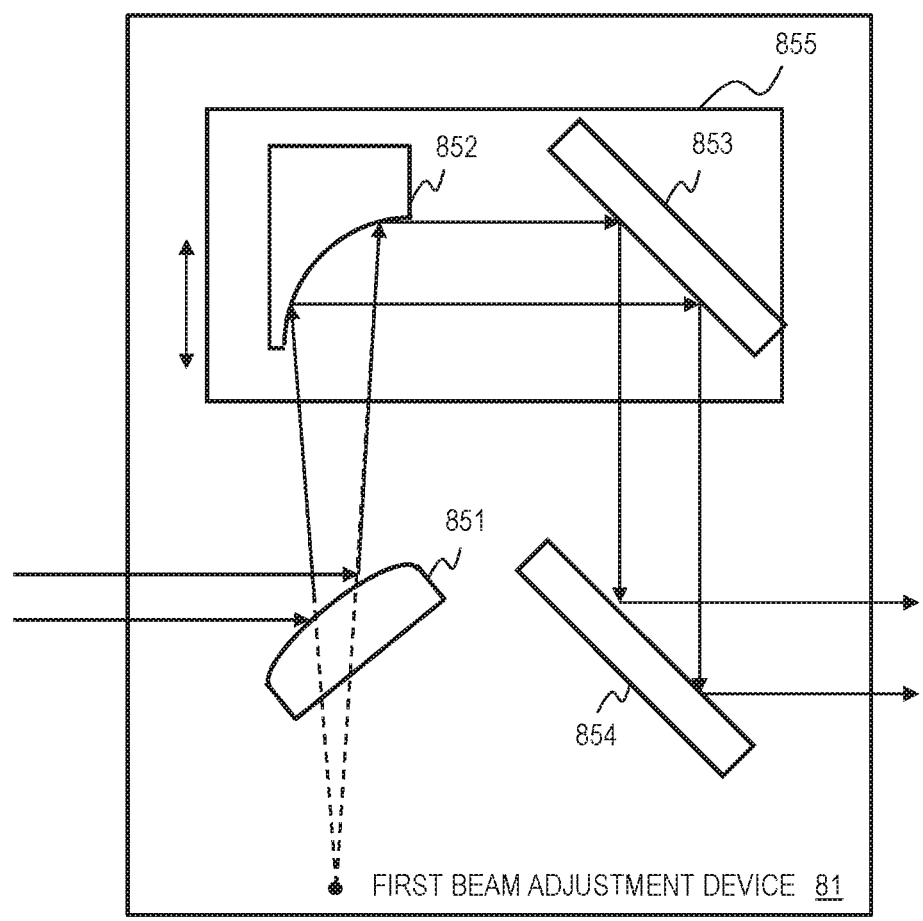
FIG. 8 illustrates another configuration example of the first beam adjustment device.

FIG. 8 illustrates another configuration example of the first beam adjustment device 81. The second beam adjustment device 82 may also have the same configuration. The first beam adjustment device 81 may include an off-axis parabolic convex mirror 851, an off-axis parabolic concave mirror 852, a plane mirror 853, a plane mirror 854, a mirror fixing plate 855, and a not-shown driving mechanism.

The off-axis parabolic convex mirror 851 may be anchored with a not-shown mirror holder to the place to receive the laser beam. The off-axis parabolic convex mirror 851 may reflect the laser beam toward the off-axis parabolic concave mirror 852.

The reflection off the off-axis parabolic convex mirror 851 may be adjustable to be regarded as the beam having the same wavefront as the light radiated from the focal point of the off-axis parabolic concave mirror 852. In the case where plane waves are coming, the focal point of the off-axis parabolic convex mirror 851 may be located at the same position as the focal point of the off-axis parabolic concave mirror 852.

The off-axis parabolic convex mirror 852 may be secured to the mirror fixing plate 855 with a not-shown mirror holder to be movable along the optical path of the laser beam reflected by the off-axis parabolic convex mirror 851. The off-axis parabolic convex mirror 852 may reflect the laser beam reflected by the off-axis parabolic convex mirror 851 toward the plane mirror 853.

The plane mirror 853 may be secured to the mirror fixing plate 855 with a not-shown mirror holder to be movable together with the off-axis parabolic concave mirror 852. The plane mirror 853 may reflect the laser beam reflected by the off-axis parabolic concave mirror 852 toward the plane mirror 854.

The plane mirror 854 may be fixed on the optical path of the laser beam reflected by the plane mirror 853 with a not-shown mirror holder. The plane mirror 854 may reflect the laser beam reflected by the plane mirror 853 toward an optical element disposed between the plane mirror 854 and the chamber 2.

The mirror fixing plate 825 may be movable by the driving mechanism in the longitudinal direction of the drawing sheet to extend and contract the distance between the mirror fixing plate 825 and the off-axis parabolic convex mirror 851 and the distance between the mirror fixing plate 825 and the plane mirror 854. Extending or contracting the distance between the mirror fixing plate 825 and the off-axis parabolic convex mirror 851 and the distance between the mirror fixing plate 825 and the plane mirror 854 may lead to adjusting the cross-sectional area of the laser beam.

8. Beam Monitor

Configuration Example 1

Figure 9A:
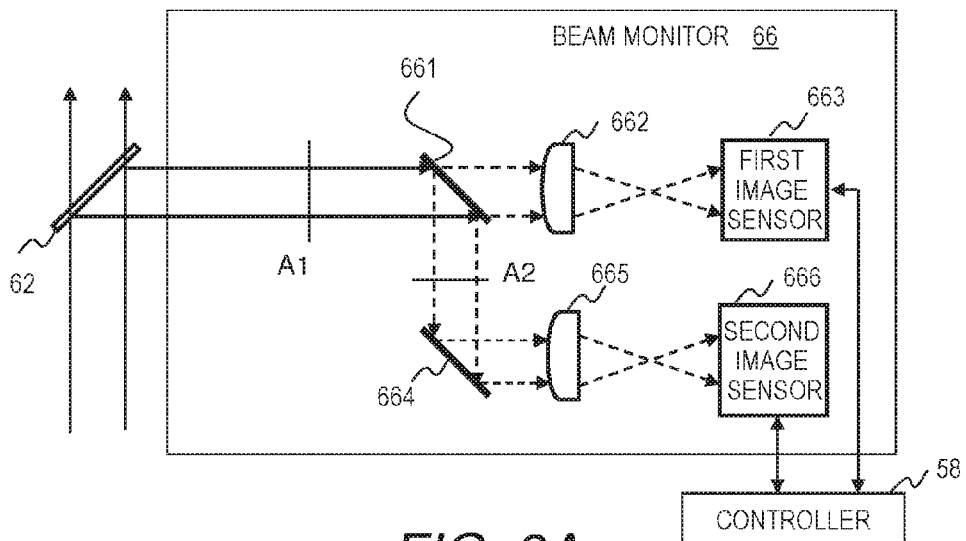
FIG. 9A illustrates a configuration example of a beam monitor.
Figure 9B:
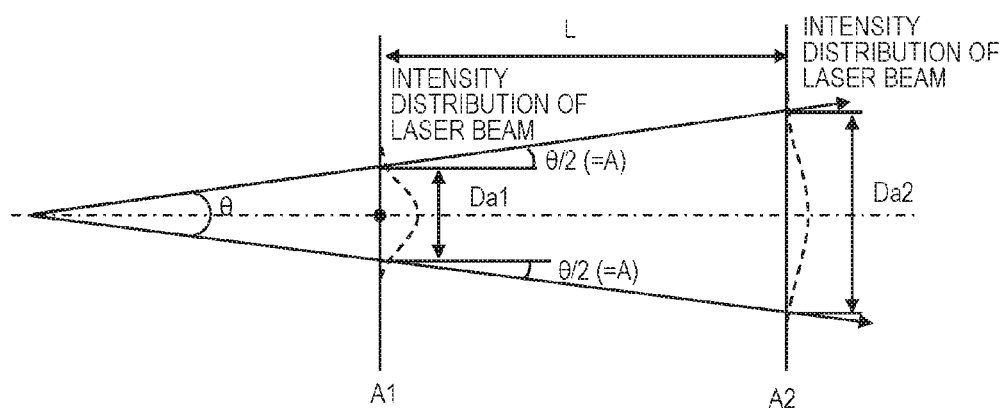
FIG. 9B is a diagram for illustrating a principle of detection by the beam monitor.
Figure 9C:
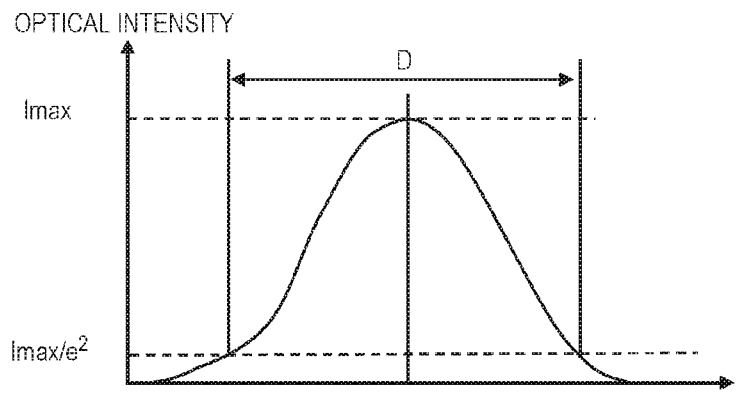
FIG. 9C is a diagram for illustrating a principle of detection by the beam monitor.

FIG. 9A illustrates a configuration example of the beam monitor 66. FIGS. 9B and 9C are diagrams for illustrating the principle of detection by the beam monitor 66. The beam monitor 66 may split the sample beam with a beam splitter 661 to give different optical path lengths to the beam passed by the beam splitter 661 and the beam reflected by the beam splitter 661 to detect their beam profiles.

The beam profile may be distribution of optical intensity in a cross-section of the laser beam. The beam monitor 66 may detect beam profiles at two different positions in the traveling directions of the sample beam. The sample beam may be a laser beam split from the optical path between the laser system 3 and the chamber 2 to enter the beam monitor 66.

As illustrated in FIG. 9A, the beam monitor 66 may include a beam splitter 661, a high reflectance mirror 664, a transfer optical system 662, a transfer optical system 665, a first image sensor 663, and a second image sensor 666. The first image sensor 663 and the second image sensor 666 may be two-dimensional image sensors.

The beam splitter 661 may pass a part of the sample beam toward the transfer optical system 662 and reflect the other part toward the high reflectance mirror 664. The high reflectance mirror 664 may reflect the beam reflected by the beam splitter 661 toward the transfer optical system 665 at high rate.

The transfer optical system 662 may transfer the beam profile at a given position A1 between the beam combiner 62 and the beam splitter 661 on the optical path of the sample beam to the light-receiving face of the first image sensor 663. The transfer optical system 665 may transfer the beam profile at a position A2 on the optical path of the sample beam to the light-receiving face of the second image sensor 666.

The distance between the position A1 and the light-receiving face of the first image sensor 663 along the optical path of the sample beam may be equal to the distance between the position A2 and the light-receiving face of the second image sensor 666 along the optical path of the sample beam. The first image sensor 663 and the second image sensor 666 may output the data of the beam profiles transferred to their light-receiving faces to the controller 58.

For example, the controller 58 may calculate parameters on the wavefront of the laser beam based on the output data from the first image sensor 663 and the second image sensor 666.

As illustrated in FIG. 9B, the controller 58 may calculate the beam width Da1 of the laser beam at the position A1 based on the output data from the first image sensor 663. As illustrated in FIG. 9C, the beam width in a beam profile may be the width of the part having an intensity equal to or higher than $1/e^2$ of the peak intensity in the distribution of optical intensity. The controller 58 may further calculate the beam width Da2 of the laser beam at the position A2 based on the output from the second image sensor 666.

The controller 58 may calculate parameters on the wavefront of the laser beam from the difference between the beam widths Da1 and Da2 of the laser beam. The controller 58 may calculate a beam divergence θ as a parameter on the wavefront using the following formula. Hereinafter, assume A=θ/2.

$$A=\tan^{-1}\{(Da2-Da1)/2L\}$$

where L may be a distance between the position A1 and the position A2 along the optical path of the sample beam.

The controller 58 may calculate the curvature X of the wavefront at the position A1 using the following formula:

$$X=2 \sin A/(Da1)$$

The controller 58 may determine the position of the laser beam to be the center of mass of the image formed on the two-dimensional image sensor.

The controller 58 may control the first beam adjustment device 81 and the second beam adjustment device 82 based on the results of the foregoing calculations.

Configuration Example 2

Figure 10:
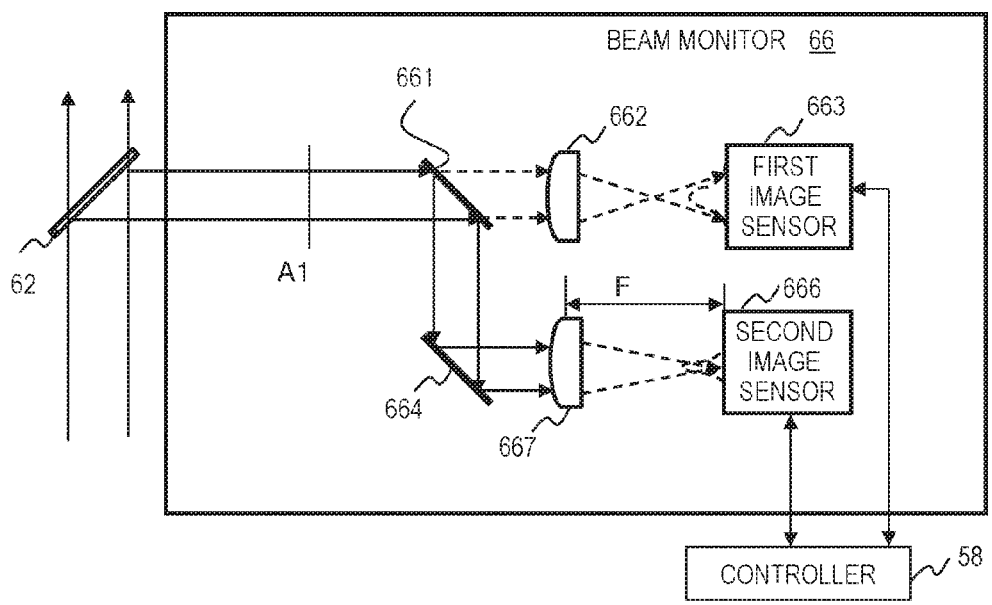
FIG. 10 illustrates another configuration example of the beam monitor.

FIG. 10 is another configuration example of the beam monitor 66. Hereinafter, differences from the configuration example illustrated in FIG. 9 are mainly described. The beam monitor 66 may include a focusing optical system 667 in place of the transfer optical system 665. The beam splitter 661 may pass a part of the sample beam toward the transfer optical system 662 and reflect the other part toward the high reflectance mirror 664 and the focusing optical system 667.

The focusing optical system 667 may focus the beam reflected by the beam splitter 661 to the light-receiving face of the second image sensor 666 disposed distant from the focusing optical system 667 by a specific distance F. The specific distance F may be a distance at which a laser beam having a requested wavefront is focused by the focusing optical system 667. The requested wavefront may be a wavefront configured to provide specified light collecting performance at the plasma generation region 25.

In the case where the requested wavefront is plane, the specific distance F may be the focal length of the focusing optical system 667. In the case where the requested wavefront is convex, the specific distance F may be a distance longer than the focal length of the focusing optical system 667. In the case where the requested wavefront is concave, the specific distance F may be a distance shorter than the focal length of the focusing optical system 667.

The controller 58 may calculate the beam width D of the laser beam at the position A1 based on the output from the first image sensor 663. The beam width D may be the width of the part having an intensity equal to or higher than $1/e^2$ of the peak intensity in the distribution of optical intensity detected by the first image sensor 663.

The controller 58 may further calculate the spot width Sd of the focused sample beam as a parameter on the wavefront based on the output from the second image sensor 666. The spot width Sd may be $1/e^2$ of the diameter of the focal spot on the second image sensor 666.

The controller 58 may calculate the beam divergence θ as a parameter on the wavefront using the following formula:

$$\theta=Sd/F$$

The controller 58 may calculate the curvature X of the wavefront at the position A1 using the following formula:

$$X=2 \sin A/D$$

The controller 58 may control the first beam adjustment device 81 and the second beam adjustment device 82 based on the results of the foregoing calculations.

As set forth above, the present invention has been described with reference to embodiments; the foregoing description is merely provided for the purpose of exemplification but not limitation. Accordingly, it is obvious for a person skilled in the art that the embodiments in this disclosure may be modified within the scope of the appended claims.

A part of the configuration of an embodiment may be replaced with a configuration of another embodiment. A configuration of an embodiment may be incorporated to a configuration of another embodiment. A part of the configuration of each embodiment may be removed, added to a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. A laser system comprising:
   a laser apparatus including:
   a first pre-pulse laser apparatus configured to output a first pre-pulse laser beam to illuminate a target supplied to an extreme ultraviolet light chamber;

a second pre-pulse laser apparatus configured to output a second pre-pulse laser beam to illuminate the target at a time different from the first pre-pulse laser beam; and a main pulse laser apparatus configured to output a main pulse laser beam to illuminate the target at a time different from both of the first pre-pulse laser beam and the second pre-pulse laser beam; and a transmission system configured to transmit pulse laser beams outputted by the laser apparatus to the extreme ultraviolet light chamber, the transmission system including:

an optical path adjustment device configured to substantially unify an optical path of the first pre-pulse laser beam and an optical path of the second pre-pulse laser beam;

an optical path separation device configured to separate the optical paths of the first pre-pulse laser beam and the second pre-pulse laser beam substantially unified by the optical path adjustment device to an optical path for the first pre-pulse laser beam and an optical path for the second pre-pulse laser beam;

a first beam adjustment device disposed on the optical path for the first pre-pulse laser beam separated by the optical path separation device and configured to adjust a beam parameter of the first pre-pulse laser beam; and a second beam adjustment device disposed on the optical path for the second pre-pulse laser beam separated by the optical path separation device and configured to adjust a beam parameter of the second pre-pulse beam.

2. The laser system according to claim 1, wherein the first pre-pulse laser beam and the second pre-pulse laser beam have the same wavelength and different pulse widths.

3. The laser system according to claim 1,
wherein the first pre-pulse laser beam and the second pre-pulse laser beam are in different linear polarization states on the optical paths of the first pre-pulse laser beam and the second pre-pulse laser beam substantially unified by the optical path adjustment device, and
wherein the optical path separation device is configured with a first polarizing beam splitter.

4. The laser system according to claim 3, wherein a $\lambda/2$ plate is disposed upstream of the optical path separation device and on the optical paths of the first pre-pulse laser beam and the second pre-pulse laser beam substantially unified by the optical path adjustment device.

5. The laser system according to claim 3, wherein a second polarizing beam splitter is disposed at least either upstream or downstream of the first polarizing beam splitter and on the optical path of the first pre-pulse laser beam separated by the optical path separation device.

6. The laser system according to claim 1, further comprising:

a beam monitor configured to monitor the first pre-pulse laser beam adjusted by the first beam adjustment device and the second pre-pulse laser beam adjusted by the second beam adjustment device; and a controller configured to control the first beam adjustment device and the second beam adjustment device based on monitoring results of the beam monitor.

7. The laser system according to claim 1,
wherein, the laser apparatus is provided on a first floor, and
wherein, the first beam adjustment device and the second beam adjustment device are provided on a second floor different from the first floor.

8. The laser system according to claim 7, wherein, the first floor is a sub-fab floor and the second floor is a cleanroom floor.

9. The laser system according to claim 7, wherein, the first floor is located downstairs of the second floor.

10. The laser system according to claim 1, wherein, the first beam adjustment device is configured to adjust at least one of a position of the first pre-pulse laser beam, a shape of the first pre-pulse laser beam, a cross-sectional area of the first pre-pulse laser beam, a divergence of the first pre-pulse laser beam, a wavefront of the first pre-pulse laser beam, and a travelling direction of the first pre-pulse laser beam.

11. The laser system according to claim 1, wherein, the second beam adjustment device is configured to adjust at least one of a position of the second pre-pulse laser beam, a shape of the second pre-pulse laser beam, a cross-sectional area of the second pre-pulse laser beam, a divergence of the second pre-pulse laser beam, a wavefront of the second pre-pulse laser beam, and a travelling direction of the second pre-pulse laser beam.

* * * * *